United States Patent

Gönner

[11] Patent Number: 6,000,462
[45] Date of Patent: Dec. 14, 1999

[54] COOLING DEVICE FOR ELECTRICAL OR ELECTRONIC COMPONENTS

[75] Inventor: Johannes Gönner, Bad Honnef, Germany

[73] Assignee: Hoogovens Aluminum Profiltechnik GmbH, Bonn, Germany

[21] Appl. No.: 09/130,992

[22] Filed: Aug. 7, 1998

[30] Foreign Application Priority Data

Aug. 28, 1997 [DE] Germany ............... 297 15 585 U

[51] Int. Cl.[6] .................................................. H05K 7/20
[52] U.S. Cl. ........................ 165/80.3; 165/185; 361/704
[58] Field of Search ................... 165/80.3, 185; 29/890.03; 361/704; 174/16.3; 257/722

[56] References Cited

U.S. PATENT DOCUMENTS 5,771,966   6/1998   Jacoby ............................. 165/185
5,791,406   8/1998   Gonner et al. .................... 165/185

FOREIGN PATENT DOCUMENTS 257157   12/1985   Japan ............................. 165/185

*Primary Examiner*—Leonard Leo
*Attorney, Agent, or Firm*—Wallenstein & Wagner, Lt.d

[57] ABSTRACT

In a cooling device for electrical or electronic components, in which rib-like cooling elements (3) made of good heat-conducting material are thereby connected to a base plate (2) carrying the components (1a, 1b, 1c) to be cooled that the web-like bases (3a) of the cooling elements (3) are fixed in slot-like longitudinal notches (4) of the base plate (2), the fixing is thereby improved that the groove-shaped indentation (4a) in the side wall (4c) of the longitudinal notch is shaped and dimensioned in free cross-section in such a way that the permanent molding of the side wall of the profile base (3a) takes place without essential bending deformation of the profile limbs of the cooling elements (3) rising from the longitudinal notch (4).

17 Claims, 2 Drawing Sheets

COOLING DEVICE FOR ELECTRICAL OR ELECTRONIC COMPONENTS

DESCRIPTION

TECHNICAL FIELD

The invention relates to a cooling device for electrical or electronic components.

BACKGROUND OF THE INVENTION

In a known cooling device (EP-A-0 696 160) of similar type, the rib-like cooling elements, made of good heat-conducting material, are fixed in slot-like longitudinal notches of a base plate which serves for the fastening of electrical or electronic components to be cooled. The fixing of the rib-like cooling elements in the slot-like longitudinal notches takes place by clamping, in that a stretched piece of wire, in the area of the end of adjacent profile limbs, i.e., the profile base of the rib-like cooling elements, is pressed in such a way that the ribbon-shaped material of the cooling elements, in the area of these ends, is pressed against the longitudinal walls of the longitudinal notches. In order to improve the fixing, it is also intended to have the longitudinal notches dovetail-shaped. Furthermore, it is suggested to provide for groove-like indentations in the side walls of the longitudinal notches.

Furthermore, it is known (EP-A-0 483 058) to slit the areas between adjacent longitudinal notches and, after insertion of the cooling elements shaped as hollow bodies, to press the base plate material in the area of the side walls of such longitudinal notches inwards in such a way that the ends of the cooling elements are clamped between the side walls.

SUMMARY OF THE INVENTION

The invention is based on the object to provide for a still better fixing of the rib-like cooling elements in the base plate by simple means without bending parts of the cooling elements rising therefrom.

According to the invention, groove-shaped indentations are formed out and dimensioned in the side walls of the longitudinal notches in such a way that the permanent deformation of the relevant side-panel of the profile base takes place without significant bending deformation of the profile limbs rising from the longitudinal notch.

In this case, it is recommended to let the groove-shaped indentations run not rectangular in cross-section but curved in such a way in order to have a gradual transition from the basically parallel side walls to the indentations and within the indentations. The radius of curvature should amount to about 0.5 to 1-fold the ribbon thickness of the cooling elements. Hereby, an optimum flow behavior results during the permanent molding of the cooling elements made in particular of aluminum and actually limited in the rheological sense to the relevant profile base area. In this case, it is recommended to have the cooling elements, still in the longitudinal notches in the area between the groove-shaped indentations and the base plate surface beyond which they jut out, supported at the side by parallel side wall panels of the longitudinal notches and actually in sufficient extent of at least 1-fold the ribbon thickness of the cooling elements.

Moreover, it is recommended to have the longitudinal notches show a depth—within the base plate—of between 3- and 15-fold and a width of between 5- and 20-fold the ribbon thickness of the cooling elements.

Particularly favorable conditions without changing the vertical alignment of the rib-like cooling elements—vertically rising from the base plate surface—are therefore then reached if the side walls of the longitudinal notches run into this vertical direction, which means, contrary to the state of the art, being not arranged dovetailed and if the groove-like indentations are situated at the distance of the notch base as well as also at the distance of the surface of the base plate. Hereby, the danger of bending the parts of the cooling elements jutting out from the base plate, upon their insertion and pressing into the longitudinal notches, is prevented. The distance of the middle of the groove-like indentations from the notch base should amount to between 2 to 8-fold the ribbon thickness of the cooling elements.

Moreover, it is recommended to have also at the notch base no abrupt transitions to the side walls of the longitudinal notches, but to have the notch base passing over to the side walls rounded with a radius of curvature that amounts to between 1 to 3-fold the ribbon thickness of the cooling elements.

The transition of the side walls to the surface of the base plate and to the groove-like indentations should also take place with a radius of curvature that amounts to 0.3 to 1-fold the ribbon thickness of the cooling elements.

Particularly favorable results are then achieved if easily deformable, good heat-conducting aluminum, e.g., pure aluminum, is used as material for the rib-shaped cooling elements, the base plate and the wire pieces that serve for the permanent extrusion molding of the profile bases and the clamping thereof in the longitudinal notches. Commercially available aluminum wire can be used for the wire pieces.

BRIEF DESCRIPTION OF THE DRAWINGS

Embodiments of the invention are now illustrated in more detail with respect to the drawing. It is shown in.

DETAILED DESCRIPTION

Figure 1:
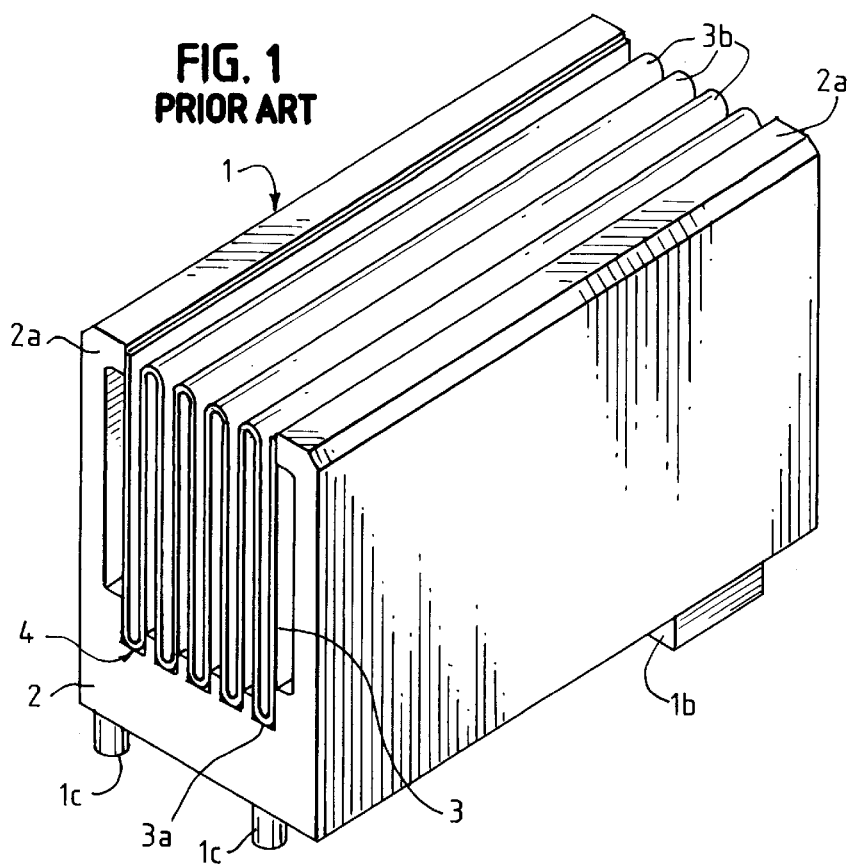
FIG. 1, a cooling device according to the state of the art.

According to FIG. 1, electrical and electronic components 1a, 1b, 1c, heating up in operation and the heat of which should be carried off in a simple manner by means of the cooling device 1, are fastened onto the rear side of a base plate 2, made of aluminum, which is completed to a roughly U-shaped profile in cross-section by two side walls 2a. In this case, the base plate 2 is provided with longitudinal notches 4, running in the longitudinal direction, in which the lower bent ends 3a of rib-shaped cooling elements 3 are inserted, the upper ends 3b of which jut out freely. All cooling elements 3 of the known cooling device consist of a meanderingly shaped aluminum ribbon. The fastening of the lower ends 3a of the cooling elements 3 in the longitudinal notches 4 of the base plate 2 is carried out in this known example by soldering.

Figure 2:
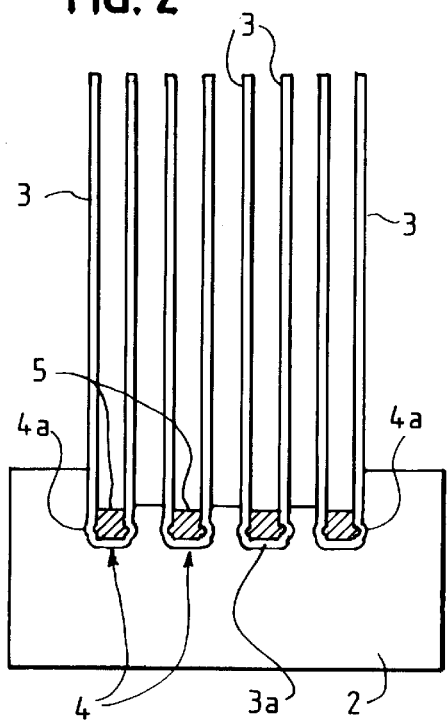
FIGS. 2 and 3, two designs of the invention in schematic side elevation.

Two cooling elements 3, in the embodiment of the invention of FIG. 2, are formed by the free limbs of a U-shaped ribbon made of pure aluminum. The webs joining both limbs of the cooling elements 3 at the lower end of which form a profile base 3a and are inserted into longitudinal notches 4 of base plate 2. In this case, pieces of wire 5 made of aluminum are squeezed in between both limbs of the respective U-shaped profile and deformed by the application of pressure in such a way that the profile bases 3a of the cooling elements 3 are permanently molded somewhat sideways outwards into the groove-shaped indentations 4a in the side walls 4c of the longitudinal notches 4.

Figure 3:
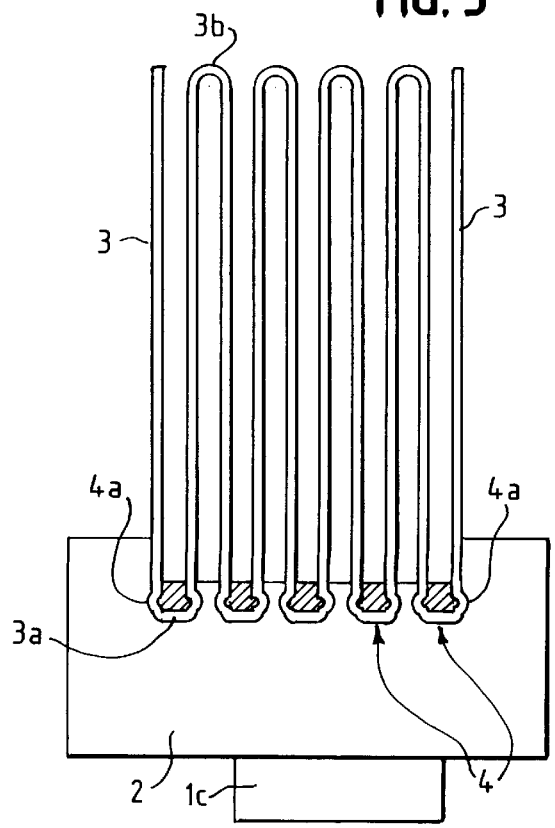

According to FIG. 1, in the design example of FIG. 3, a meandering ribbon made of pure aluminum is used for the cooling elements 3. Here also, the lower ends, i.e., the profile bases 3a within the longitudinal notches 4 of the base plate 2, are permanently deformed in such a way that material of the cooling elements 3 is permanently molded into the groove-shaped indentations 4a at both sides of the longitudinal notches 4 by extrusion. This pressing-in technique leads not only to a manufacturing technologically simple but also to secure fixing of the cooling elements 3 within the base plate 2, it also leads to a good heat transmittance from the material of the base plate 2 to the material of the cooling elements 3, so that the cooling function for cooling the electronic components 1c is very well fulfilled.

Figure 4:
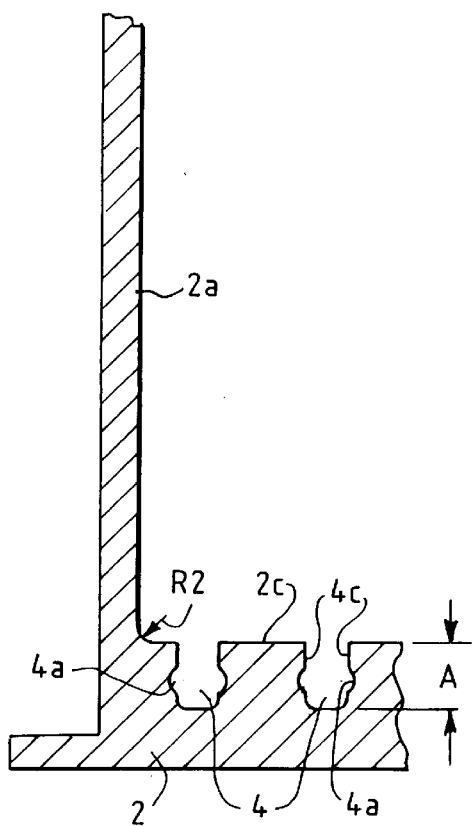
FIG. 4, a cross-section through a part of a base plate that is provided with longitudinal notches for taking up the cooling elements.

A part of a base plate 2 of the cooling device 1 is shown in a cross-sectional view in FIG. 4. Here, the side walls of the longitudinal notches 4 show groove-shaped indentations 4a running in the longitudinal direction. The longitudinal notches 4 extend into the base plate 2 up to a depth A from the surface 2c of the base plate. This surface 2c passes with a radius of curvature R2 over into the side wall 2a of the cooling device 1 rising vertically upwards from the base plate 2. No cooling elements are joined to the base plate 2 in the examples of FIG. 4.

Figure 5:
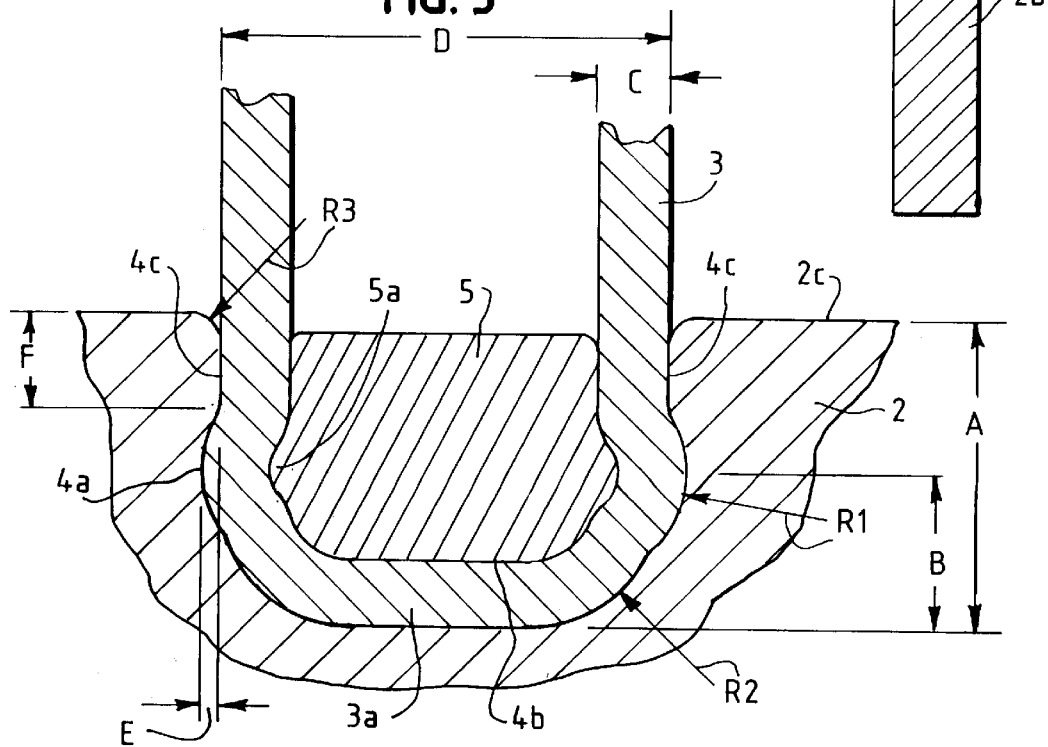
FIG. 5, a strongly magnified partial section from the area of the fixing of cooling elements in the longitudinal notch of the base plate.

On the other hand, in the magnified embodiment of the invention of FIG. 5, the lower end, i.e., the profile base 3a of a cooling element 3—e.g., of FIG. 2—is firmly fixed in the longitudinal notch 4 of the base plate 2 by extrusion. The middle of the groove-shaped indentations 4a in the side walls 4c of the longitudinal notches 4 is situated at a distance B from the notch base 4b which passes over into the side walls 4c with a radius of curvature R2. The groove-shaped indentations 4a in the side walls 4c show a radius of curvature R1. Furthermore, the side walls 4c pass over into the surface 2c of the base plate 2 rounded with a radius of curvature R3. In the area of the profile base 3a at the lower end and therefore also of the longitudinal notch 4, a piece of wire 5 is pressed in between both limbs of the U-shaped part which forms the two cooling elements 3. By applying pressure on the piece of wire 5, this is thus far permanently deformed, that it molds the material of the cooling elements 3, in the area of the groove-shaped indentations 4a, permanently into these without deforming or bending the parts of the rib-shaped cooling elements 3 rising from the base plate 2. The deforming is an extrusion molding. The groove-shaped indentations 4a penetrate with the penetration depth E of between 0.2-fold and 0.8-fold the ribbon thickness C into the base plate 2. The length F of the parallel side wall parts between the surface 2c of the base plate 2 and the transition to the groove-shaped indentation 4a should amount to between 0.8-fold and 3-fold the ribbon thickness C.

Figure 6:
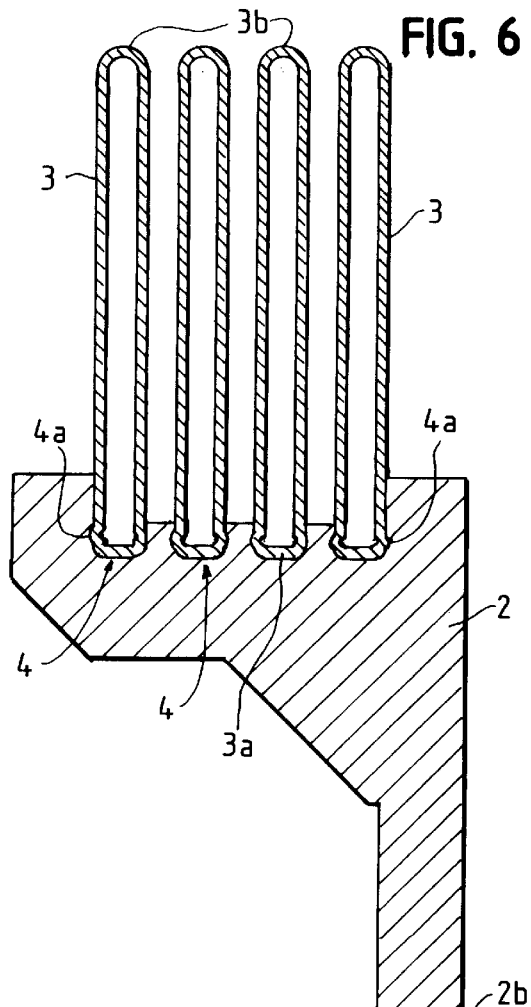
FIG. 6, another design of the invention in schematic cross-section.

The following dimensions are preferred in this example:
A=5.0 mm
B=2.5 mm
C=1.0 mm
D=7.0 mm
E=0.2 mm
F=0.4 mm
R1=0.8 mm
R2=2.0 mm
R3=0.5 mm In the embodiment of FIG. 6, which shows another modification of the invention, also a good resistance to tearing out of cooling elements 3 from the longitudinal notches 4 is thereby achieved that the profile bases 3a of the thin, here hollow-shaped cooling elements 3 are crushed by crushing forces into the groove-shaped indentations showing in this example a somewhat larger radius of curvature R1 and/or a larger penetration depth E. It may happen thereby that the hollow-body shaped cooling elements 3 are grasped by a guide tool and pressed into the longitudinal notches 4 in such a way that the parts of the cooling elements 3 rising from the base plate 2 do not bend themselves. In this example (not shown), the guide tool is comb-like in a cross-sectional view, so that the comb segments engage between adjacent cooling elements 3 thereby supporting the walls.

It turned out to be that the thickness of materials or ribbons C for the cooling elements 3 of between 0.5 mm and 1.5 mm has been proven to be particularly useful. In the event of using materials like Al, good deformation properties result for molding into the groove-shaped indentations 4a.

I claim:

1. A cooling device for electrical or electronic components comprising:
   a base plate, having a surface, for fixing the electrical or electronic components to be cooled; and
   rib-like cooling elements made of heat conducting material, connected to the base plate in heat transmitting contact, arranged substantially in parallel and at a distance from one another, and having legs;
   wherein at least two rib-like cooling elements are combined into a unitary ribbon-shaped package having a U-shaped profile in cross-section, and a web-like base which engages into a slot-like longitudinal notch in the base plate and is fixed within the notch at least partially by a permanent deformation of a side wall of the web-like base, the legs of the cooling elements rising from the longitudinal notch remaining substantially free of bending deformation, such that at least a first deformed side wall of the web-like base is pushed into a groove-shaped indentation extending in a longitudinal direction of the longitudinal notch in a side wall thereof, and a transition to the groove-shaped indentation is a distance from the surface of the base plate within a range of about 0.4-fold to about 3-fold the ribbon thickness of the cooling elements.

2. A cooling device according to claim 1 wherein the groove-shaped indentation has a radius of curvature within the range of about 0.5 to 1-fold the ribbon thickness of the cooling elements.

3. A cooling device according to claim 1 wherein the longitudinal notch has side walls running essentially parallel between the surface of the base plate and the groove-shaped indentation.

4. A cooling device according to claim 3 wherein a transition from the surface of the base plate to the side walls of the longitudinal notch and a transition from the longitudinal notch into the groove-shaped indentation are rounded.

5. A cooling device according to claim 4 wherein the side walls of the longitudinal notch pass over into the surface of the base plate with a radius of curvature within a range of about 0.3 to 1-fold the ribbon thickness of the cooling elements.

6. A cooling device according to claim 5 wherein the longitudinal notch has a depth within a range of about 3 to 15-fold and a width within a range of about 5 and 20-fold the ribbon thickness of the cooling elements.

7. A cooling device according to claim 6 wherein the groove-shaped indentation has a middle situated at a distance from the notch base of the longitudinal notch within a range of about 2 to 8-fold the ribbon thickness of the cooling elements.

8. A cooling device according to claim 7 wherein the notch base passes over into the side walls of the longitudinal notch with a radius of curvature within a range of about 1 to 3-fold the ribbon thickness of the cooling elements.

9. A cooling device according to claim 8 wherein either the cooling elements or the base plate consist of aluminum.

10. A cooling device according to claim 1 wherein a profile base of a permanently deformable piece of wire made of aluminum is extruded into the groove-shaped indentation by permanent deformation.

11. A cooling device according to claim 1 wherein the longitudinal notch has side walls running essentially parallel between the surface of the base plate and the groove-shaped indentation.

12. A cooling device according to claim 1 wherein a transition from the surface of the base plate to the side walls of the longitudinal notch and a transition from the longitudinal notch into the groove-shaped indentation are rounded.

13. A cooling device according to claim 1 wherein the side walls of the longitudinal notch pass over into the surface of the base plate with a radius of curvature within a range of about 0.3 to 1-fold the ribbon thickness of the cooling elements.

14. A cooling device according to claim 1 wherein the longitudinal notch has a depth within a range of about 3 to 15-fold and a width within a range of about 5 and 20-fold the ribbon thickness of the cooling elements.

15. A cooling device according to claim 1 wherein the groove-shaped indentation has a middle situated at a distance from the notch base of the longitudinal notch within a range of about 2 to 8-fold the ribbon thickness of the cooling elements.

16. A cooling device according to claim 1 wherein either the cooling elements or the base plate consist of aluminum.

17. A cooling device according to claim 1 wherein the notch base passes over into the side walls of the longitudinal notch with a radius of curvature within a range of about 1 to 3-fold the ribbon thickness of the cooling elements.

* * * * *